United States Patent
Logvinov et al.

(10) Patent No.: US 9,939,481 B2
(45) Date of Patent: *Apr. 10, 2018

(54) SYSTEM AND METHOD FOR AN ARC FAULT DETECTOR

(71) Applicants: STMicroelectronics, Inc., Coppell, TX (US); STMicroelectronics S.r.l., Agrate Brianza (IT)

(72) Inventors: Oleg Logvinov, East Brunswick, NJ (US); Roberto Cappelletti, Cornaredo (IT); Mauro Conti, Robbiate (IT)

(73) Assignees: STMicroelectronics S.r.l., Agrate Brianza (IT); STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/603,181

(22) Filed: May 23, 2017

(65) Prior Publication Data

US 2017/0254845 A1 Sep. 7, 2017

Related U.S. Application Data

(63) Continuation of application No. 14/037,074, filed on Sep. 25, 2013, now Pat. No. 9,696,363.

(Continued)

(51) Int. Cl.
*H01H 31/12* (2006.01)
*G01R 31/02* (2006.01)
*H04B 3/54* (2006.01)

(52) U.S. Cl.
CPC ............ *G01R 31/024* (2013.01); *H04B 3/54* (2013.01); *H04B 2203/5458* (2013.01); *H04B 2203/5495* (2013.01)

(58) Field of Classification Search
CPC ...... H02H 1/0015; H02H 1/0092; H02H 7/20; H02H 3/335; G01R 31/024; G01R 31/3272; G01R 31/3275; G01R 31/3277; G01R 31/025; G01R 31/1272; G01R 22/063; G01R 31/14; G01R 31/008; G01R 15/18;

(Continued)

(56) References Cited

U.S. PATENT DOCUMENTS 5,485,093 A * 1/1996 Russell ................ G01R 31/025
324/522
5,835,321 A 11/1998 Elms et al.
(Continued)

OTHER PUBLICATIONS

Phipps, K. et al., "Frequency Phenomenon and Algorithms for Arc Detection," 2010 IEEE International Symposium on Electromagnetic Compatibility (EMC), Jul. 25-30, 2010, pp. 183-188.

*Primary Examiner* — Vinh Nguyen
(74) *Attorney, Agent, or Firm* — Slater Matsil, LLP (57) ABSTRACT

Embodiments of the present disclosure include a method of operating an arc fault detection system, an arc fault detection system, and a system. An embodiment is a method of operating an arc fault detection system coupled to a power line, the method including determining one or more arc fault detection windows in power line signals on the power line, the power line signals comprising a communication signal and an alternating current (AC) power signal. The method further includes receiving the power line signals from the power line during the one or more arc fault detection windows, and performing arc fault detection processing on the received power line signals.

24 Claims, 5 Drawing Sheets

Related U.S. Application Data (60) Provisional application No. 61/705,321, filed on Sep. 25, 2012.

(58) Field of Classification Search
CPC .... G01R 15/183; G01R 31/022; G01R 31/08; G01R 31/086; G06F 1/266; G06F 19/00; H04B 2203/5458; H04B 2203/5495; H04B 3/54; Y04S 10/123; H02J 13/0062; H02J 13/0075; H04L 49/15
See application file for complete search history.

(56) References Cited

U.S. PATENT DOCUMENTS

| | | |
|---|---|---|
| 6,522,509 B1 | 2/2003 | Engel et al. |
| 6,917,888 B2 | 7/2005 | Logvinov et al. |
| 7,106,177 B2 | 9/2006 | Logvinov |
| 7,193,506 B2 | 3/2007 | Logvinov |
| 7,369,579 B2 | 5/2008 | Logvinov |
| 7,683,777 B2 | 3/2010 | Macaluso et al. |
| 7,804,673 B2 | 9/2010 | Macaluso et al. |
| 8,115,605 B2 | 2/2012 | Macaluso et al. |
| 9,130,657 B2 | 9/2015 | Logvinov |
| 9,647,442 B2 * | 5/2017 | Yoscovich ........ H01L 31/02021 |
| 9,696,363 B2 * | 7/2017 | Logvinov ............ G01R 31/024 |
| 2001/0036047 A1 | 11/2001 | Macbeth et al. |
| 2006/0171085 A1 | 8/2006 | Keating |
| 2006/0262466 A1 * | 11/2006 | Engel .................. H02H 1/0015 361/42 |
| 2010/0103568 A1 | 4/2010 | Lee |
| 2014/0071564 A1 | 3/2014 | Kim |

* cited by examiner

SYSTEM AND METHOD FOR AN ARC FAULT DETECTOR

CROSS-REFERENCE TO RELATED APPLICATIONS

This application is a continuation of U.S. patent application Ser. No. 14/037,074, filed Sep. 25, 2013, now U.S. Pat. No. 9,696,363, which claims the benefit of U.S. Provisional Application No. 61/705,321, filed on Sep. 25, 2012, both of which applications are hereby incorporated herein by reference.

TECHNICAL FIELD

This invention relates generally to electronic circuits, and more particularly to a system and method for an arc fault detector.

BACKGROUND

Digital and analog data communications over conventional utility and premises electric power lines is an established method for point-to-point and point-to-multipoint communications between devices. In such communications, a communication signal carrying data is superimposed on a 50 to 60 Hz alternating current (AC) power line using higher frequencies. A central computer may use such a power line communications system to control remote power applications, to monitor remote utility usage, or to support energy conservation. For example, the central computer may control the operation of heaters, air-conditioners, electric lighting and the like. The power line communications system may also be used to support high-speed broadband data to support Internet, multimedia and home entertainment systems, using a power line communication network such as IEEE 1901, IEEE P1901.2, HomePlug GP/AV/AV2/1.0, G.hn, G.hnem, and other similar technologies.

The accuracy of arc fault detecting circuits on a power line that includes a power line communications system may be diminished as the power line communications signal may be interpreted as an arc fault. For example, some arc detecting circuits analyze frequency noise content on a power line to detect arc faults, and the power line communications signal may have similar frequency noise content as that produced by an arc fault causing the arc detecting circuits to falsely identify the power line communication signal as an arc fault.

SUMMARY

An embodiment is a method of operating an arc fault detection system coupled to a power line, the method including determining one or more arc fault detection windows in power line signals on the power line, the power line signals comprising a communication signal and an alternating current (AC) power signal. The method further includes receiving the power line signals from the power line during the one or more arc fault detection windows, and performing arc fault detection processing on the received power line signals.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present disclosure will be described with respect to embodiments in a specific context, namely a system and method for an arc fault detector. Embodiments of this invention may also be applied to other circuits and systems, such as, but not limited to, communication systems such as power line communication systems.

Generally, embodiments of the present disclosure enable an arc fault detector to determine quiet intervals and/or frequencies in a power line communication signal in such way that the arc fault detector can accurately detect arc faults. By determining quiet intervals and/or frequencies, the arc fault detector can more accurately identify an arc fault signature due to the decreased noise on the power line. The decreased noise on the power line may allow for simplified processing for the arc fault detector and may reduce the incidence of a "false positive" detection of an arc fault. For example, the power line modem may alert the arc fault detector to quiet intervals when the power line communication signals are of a low value, intensity, periodicity, or the like, and the arc fault detector may primarily perform arc fault detection during these quiet intervals. In some embodiments, the arc fault detector only performs arc fault detection during these quiet intervals. In some other embodiments, the arc fault detector performs arc fault detection during quiet intervals and during active intervals of the transmission of the power line communication signals, and the arc fault detector discounts the results of the arc fault detection during the active intervals.

In an embodiment, the power line modem schedules quiet intervals that correspond to the intervals of the power line signal with the most prominent arc fault signatures. These most prominent arc fault signature intervals may be detected by the arc fault detector, which can alert the power line modem of the intervals to allow the scheduling of the quiet intervals. For example, the power line modem can suspend all communication for at least one cycle of the alternating current (AC) power signal so that the arc fault detector can "sweep" the noise during this suspended communication timeframe and the arc fault detector can find the intervals in the AC power signal where the arc fault signatures are most pronounced. In an embodiment, the arc fault detector can request these suspensions of communication (e.g. quiet intervals), and in other embodiments, the power line modem may periodically schedule these quiet intervals and communicate them to the arc fault detector. In some embodiments, the most prominent arc fault signature intervals may be determined beforehand and the power line modem is configured to not transmit power line communication signals during the predetermined intervals.

In an embodiment, the arc fault detector is capable of distinguishing between the signature of an arc fault and the signature of a multi-carrier signal, such as orthogonal frequency-division multiplexing (OFDM) signal. In some embodiments, the arc fault detector learns the properties of the multi-carrier signal during intervals with the least likely arc fault signatures. For example, in some power networks, the arc fault noise is more prevalent in the zero crossing regions of the AC power signal. In these power networks, the arc currents spikes at the zero crossing regions causing high frequency noise that may have a similar signature to a multi-carrier signal. In some embodiments where the multi-carrier signal has been identified, the arc fault detector employs a multi-carrier signal cancelation such that the arc fault signature can be detected during the multi-carrier signal transmission. For example, the arc fault detector can know the energy signature of the identified multi-carrier signal and therefore can subtract the energy signature of the identified multi-carrier signal to allow the arc fault signature to be detected during a multi-carrier signal transmission.

In an embodiment, the arc fault detector takes into account the tones or frequencies of known power line communication signals. The arc fault detector may detect or learn these power line communication signals or the power line communication signals may be supplied to the arc fault detector by the power line modem. In some embodiments, the arc fault detector ignores the tones or frequencies of the known power line communication signals. In other embodiments, the arc fault detector discounts the significance of the tones or frequencies of the known power line communication signals. For example, in a HomePlug AV system, the power line communication signals are within substantially defined frequency bands in a range from about 2 MHz to about 90 MHz, whereas an arc fault signal can be spread across the frequency spectrum from about 0 Hz to hundreds of MHz. In some embodiments, the arc fault detector analyzes the low frequency component (e.g. from about 0 Hz to about 1 MHz) of the power line signal to identify arc faults. In some embodiments, the arc fault detector analyzes the frequencies that are between the substantially defined frequency bands of the power line communication signal (e.g. the HomePlug AV signal).

In an embodiment, the arc fault detector and the power line modem are coupled together outside of the power network and communicate by control signals. For example, the power line modem may notify the arc fault detector of the quiet intervals and/or frequencies by way of the control signals. In addition, the arc fault detector may notify the power line modem of the intervals in the power line signal with the most prominent arc fault signatures by way of the control signals so that the power line modem may schedule quiet intervals during those intervals of the power line signal. In some embodiments, the arc fault detector is integrated into the power line modem. This allows for the protection of the power line modem and devices connected to the power line modem to be protected from arc faults.

Embodiments of the present invention may be directed toward devices that may be configured to operate on a power line network, for example, consumer electronic devices, computing devices, appliances, and lighting systems such as light-emitting diodes (LED) or compact fluorescent lamp (CFL) lighting. Devices, such as computing devices may use the power line network to communicate with or to control other devices and appliances on the power line network and/or to access a local area or wide area network, such as the Internet.

Figure 1A:
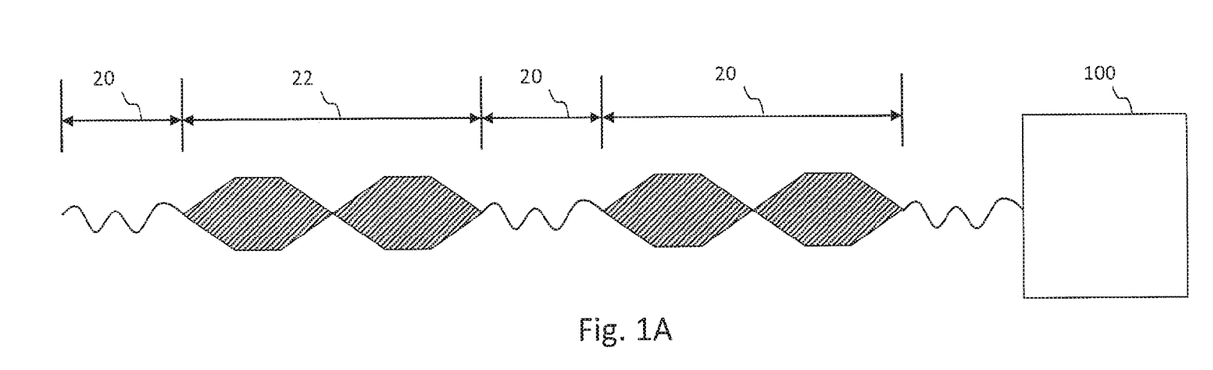
FIG. 1A illustrates a time domain representation of a power line communication signal in accordance with an embodiment.

FIG. 1A illustrates an embodiment of a power line communication signal, in the time domain, being transmitted and/or received by a power line communication system 100. The power line communication signal includes quiet intervals 20 and active intervals 22. The power line communication system 100 may detect the active intervals 22 and the quiet intervals 22 and may use the knowledge of these intervals to modify the operation of power line communication system 100 as discussed further below.

Figure 1B:
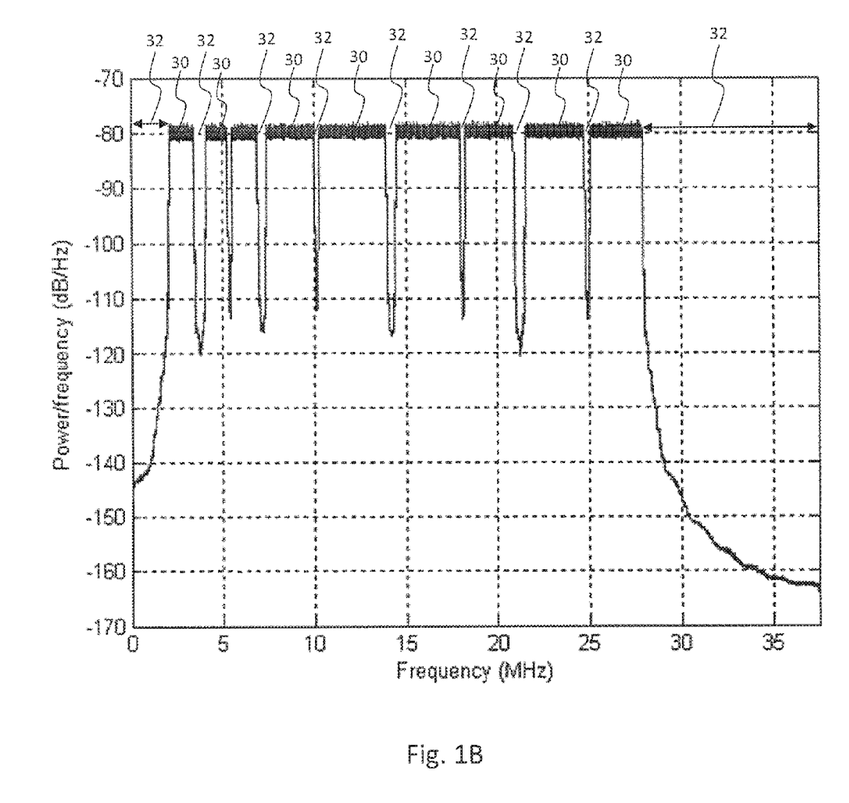
FIG. 1B illustrates a frequency domain representation of a power line communication in accordance with an embodiment.

FIG. 1B illustrates an embodiment of a power line communication signal in the frequency domain. The power line communication signal includes substantially defined frequency bands 30 (which may also be referred to as channels 30) and quiet bands 32 in which the power line communication signal is attenuated. As illustrated, the frequency bands 30 create large quiet bands 32 at frequencies below and above the frequency bands 30. The power line communication system 100 may detect the active bands 30 and the quiet bands 32 and may use the knowledge of these intervals to modify the operation of power line communication system 100 as discussed further below. The quiet intervals 20 and the quiet bands 32 may both be referred to as arc fault detection windows.

Figure 2:
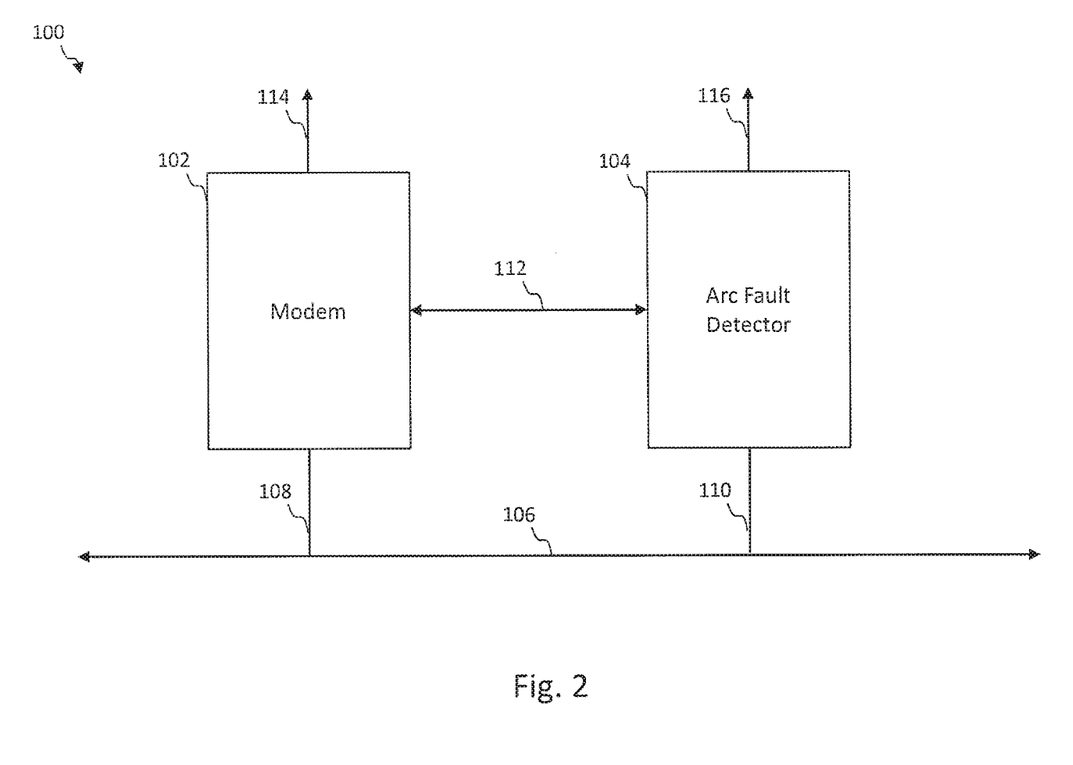
FIG. 2 illustrates a power line communication system in accordance with an embodiment.

FIG. 2 illustrates a power line communication system 100 having a modem 102, an arc fault detector 104, and an AC power line 106. The modem 102 is coupled to the AC power line 106 via a communication interface 108 and the arc fault detector 104 is coupled to the AC power line via the power interface 110. The modem 102 has a data I/O link 114 to transmit and receive digital data to and from an I/O device, such as a computing device, coupled to the modem 102. The modem 102 and the arc fault detector 104 are coupled together by a control signal 112. In some embodiments, the modem 102 uses the control signal 112 to modify the operation of the arc fault detector 104. In some embodiments, the arc fault detector 104 uses the control signal 112 to modify the operation of the modem 102.

In some embodiments, the modem 102 and the arc fault detector 104 of the power line communication system 100 and other components described as performing data or signal-processing operations constitute a software module, a hardware module, or a combined hardware/software module. In addition, each of the modules suitably contains a memory storage area, such as random access memory (RAM), for storage of data and instructions for performing processing operations in accordance with the present invention. Alternatively, instructions for performing processing operations can be stored in hardware in one or more of the modules.

The AC power line 106 includes a power line communication network (see FIGS. 1A and 1B as examples) such as IEEE 1901, IEEE P1901.2, HomePlug GP/AV/AV2/1.0, G.hn, G.hnem, or other similar technologies. In an embodiment where the AC power line 106 includes a power line communication network, such as an IEEE 1901 network, the modem 102 may be a power line modem 102.

The arc fault detector 104 includes a memory (not shown) and an arc fault alarm 116. The arc fault alarm indicates an arc fault event has been detected by the arc fault detector 104 and data corresponding to detected arc fault event may be stored in the memory of the arc fault detector 104. In some embodiments, once an arc fault is detected, the arc fault detector 104 performs additional processing on the power line communication signal to try to obtain more information about the arc fault event such as the location of the event. In some embodiments, the memory of the arc fault detector 104 includes data representative of identifiable arc fault signatures, which can be used to determine that an arc fault has occurred on the AC power line 106. The arc fault signatures correspond to those signals that may be generated and/or transmitted over a power line network when an arc fault event occurs on the power line network. For example, the arc fault signature data may include a unique radio frequency (RF) signature representative of the high frequency emission that occurs when the arc fault ignites and again when the arc fault extinguishes.

In some embodiments, the memory of the arc fault detector 104 includes signature data for the various power line network protocols such that the arc fault detector 104 can identify which power line network protocol (e.g. HomePlug AV, IEEE 1901, etc.) is in use. The arc fault detector 104 may then use the identified protocol to determine quiet intervals and/or quiet bands which may simplify the processing of the arc fault detection data as discussed below. The protocol data may include preamble data or other characteristics of the various protocols.

In an embodiment, the arc fault detector 104 can identify a multi-carrier signal, such as an OFDM signal. The arc fault detector 104 can learn the properties of the multi-carrier signal during intervals with the least likely arc fault signatures. When the multi-carrier signal has been identified, the arc fault detector 104 can employs a multi-carrier signal cancellation such that the arc fault signature can be detected more accurately while the multi-carrier signal is being transmitted.

In some embodiments, the modem 102 passes the protocol information to the arc fault detector 104 by way of the control signal 112. When the modem 102 detects a quiet interval (see quiet intervals 20 in FIG. 1A) in the power line communication signal, the control signal 112 is activated to alert the arc fault detector 104 of the quiet interval. The quiet interval may simplify the monitoring and processing performed by the arc fault detector 104 by permitting the arc fault detector 104 to detect an arc fault signature without the noise of the power line communication signal. The quiet interval may also increase the accuracy of the monitoring and processing performed by the arc fault detector 104. In some embodiments, the arc fault detector 104 only performs arc fault detection during these quiet intervals. In some other embodiments, the arc fault detector 104 performs arc fault detection during quiet intervals and during the active intervals (see active intervals 22 in FIG. 1A), and the arc fault detector 104 discounts the results of the arc fault detection during the active intervals of the power line communication signal.

In another embodiment, the modem 102 alerts the arc fault detector 104 to quiet bands (see quiet bands 32 in FIG. 1B) in the power line communication signal by way of the control signal 112. Similar to the quiet intervals, the quiet bands may simplify the monitoring and processing performed by the arc fault detector 104 by permitting the arc fault detector 104 to detect an arc fault signature without the noise of the power line communication signal. In an embodiment, the arc fault detector 104 only performs arc fault detection during these quiet bands. In another embodiment, the arc fault detector 104 performs arc fault detection during quiet bands and during active bands (see active bands 30 in FIG. 1B) and the arc fault detector 104 discounts the results of the arc fault detection during the active bands of the power line communication signal. In another embodiment, the arc fault detector 104 analyzes a low frequency component of the power line communication signal for arc fault signature data, where the low frequency component is in a range from about 0 Hz to about 1 MHz.

In an embodiment, the arc fault detector 104 is implemented as a software module. In another embodiment, the arc fault detector 104 is implemented as a hardware module or a combined hardware/software module. By implementing the arc fault detector 104 as a hardware module or a combined hardware/software module, the amount of time required to detect an arc fault event may be decreased as hardware can respond faster than software in many instances. For example, the arc detector may be implemented in software running on a computational engine that receives the digitized signal from an analog-to-digital converter that samples the power line signals. The power line signals may undergo processing before the analog-to-digital converter, such as filtering and/or amplification.

Figure 3:
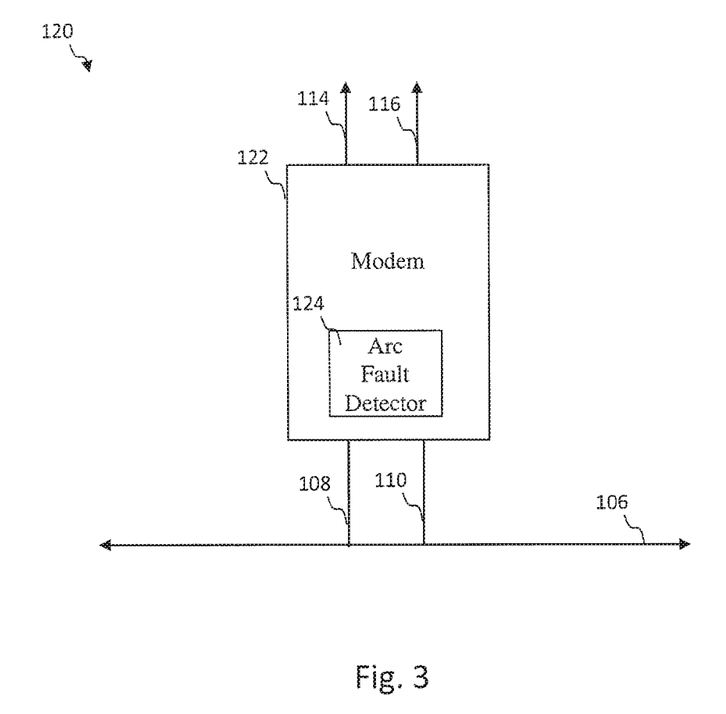
FIG. 3 illustrates a power line communication system in accordance with another embodiment.

FIG. 3 illustrates a power line communication system 120 with an arc fault detector 124 integrated within a modem 122. The details and operation of the power line communication system 120 is similar to the power line communication system 100 described above and the description is not repeated herein, although the power line communication system 120 and the power line communication system 100 need not be the same.

In another embodiment, the arc fault detector 124 or 104 may be integrated with power line communication system that includes an integrated switching power supply, as described in U.S. patent application Ser. No. 13/656,369, entitled, "System and Method for a Power Line Modem," which application is incorporated herein by reference in its entirety.

Figure 4:
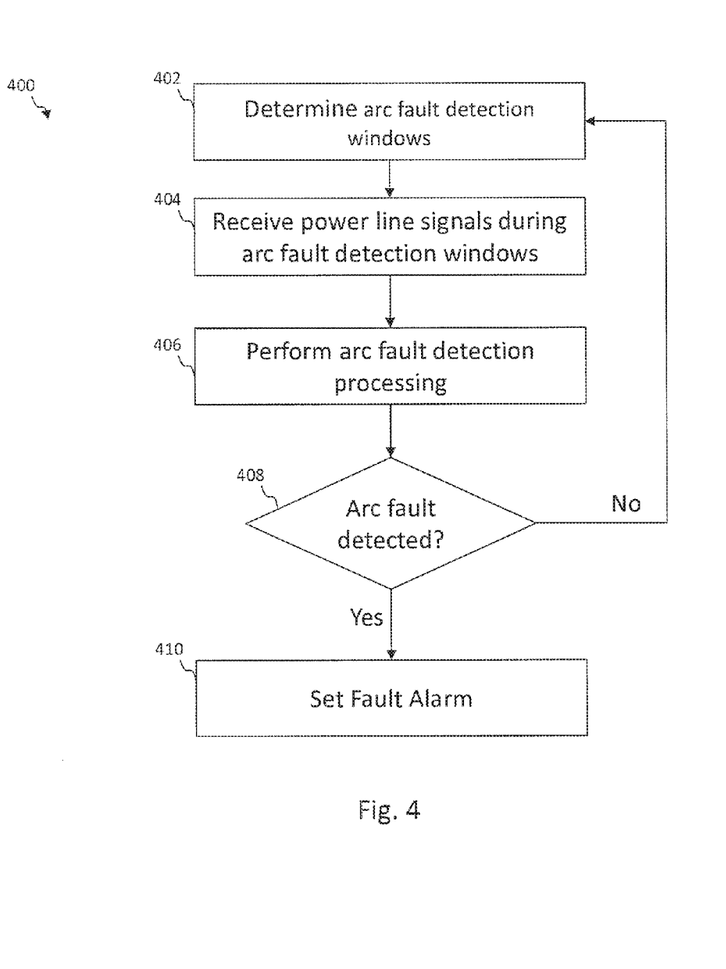
FIG. 4 illustrates a process flow diagram in operating a power line communication system in accordance with an embodiment.

FIG. 4 illustrates a process flow 400 of a method in accordance with an embodiment. In step 402, one or more arc fault detection windows are determined in the power line signals on the power line. The arc fault detection windows may be similar, for example, to the quiet intervals 20 shown in FIG. 1A and/or the quiet bands 32 shown in FIG. 1B. Once the arc fault detection windows have been determined, in step 404, the power line signals are received by the arc fault detector during the arc fault detection windows. In step 406, the arc fault detection processing may be performed on the received power line signals. Next, in step 408, the arc fault detector determines whether an arc fault was detected in the arc fault detection processing. If an arc fault was detected, a fault alarm is set in step 410. If an arc fault was not detected, the process restarts at step 402 by determining more arc fault detection windows.

An embodiment is a method of operating an arc fault detection system coupled to a power line, the method including determining one or more arc fault detection windows in power line signals on the power line, the power line signals comprising a communication signal and an alternating current (AC) power signal. The method further includes receiving the power line signals from the power line during the one or more arc fault detection windows, and performing arc fault detection processing on the received power line signals.

Another embodiment is an arc fault detection system configured to be coupled to a power line, the arc fault detection system including an arc fault detector configured to detect an arc fault on the power line, and a power line modem configured to transmit and receive data on the power line. The power line modem includes a first node configured to be coupled to the arc fault detector, the first node being configured to signal the arc fault detector to modify detection behavior of the arc fault detector.

A further embodiment is a system including a power line modem configured to be coupled to a power line, the power line modem being configured to detect a quiet interval in a transmission on the power line and indicate via a first control signal that a quiet interval is being detected. The system further includes an arc fault detector coupled to the first control signal and configured to be coupled to the power line, the arc fault detector modifying its detection behavior such that arc fault detection is more accurate during the quiet interval.

Advantages of embodiments include the ability to achieve accurate arc fault detection on power lines that include a power line communication system. Because, the power line communication signal can have a signature that may be similar to the signature of an arc fault, analyzing the power line communication signal during a quiet interval, the accuracy and speed of the arc fault detection may be increased, as the processing required to detect the arc fault may be simpler than processing the arc fault detection during an active interval of the power line communication signal. Further advantages of some embodiments include the integration of an arc detector with a power line modem such that the power line modem and devices connected to it are protected from arc faults.

The following U.S. Patent Application Publications and U.S. patents are incorporated herein by reference in their entirety: U.S. Pat. No. 6,917,888, entitled, "Method and system for power line network fault detection and quality monitoring;" U.S. Pat. No. 7,106,177, entitled, "Method and system for modifying modulation of power line communications signals for maximizing data throughput rate;" U.S. Pat. No. 7,193,506, entitled, "Method and system for maximizing data throughput rate in a power line communications system by modifying payload symbol length;" U.S. Pat. No. 7,369,579, entitled, "Method and system for timing controlled signal transmission in a point to multipoint power line communications system;" U.S. Pat. No. 7,683,777, entitled, "Method and system for audio distribution in installations where the use of existing wiring is preferred;" U.S. Pat. No. 7,804,673, entitled, "Intelligent, self-aware power line conditioning and communication node;" and U.S. Pat. No. 8,115,605, entitled, "Power line communications device in which physical communications protocol layer operation is dynamically selectable." Systems and methods described in the above mentioned U.S. patents can be applied to embodiments described herein.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A method of communicating over a power line, the method comprising:
communicating a power line signal over the power line, wherein the power line signal comprises a communication signal modulated on an alternating current (AC) power signal; and
performing arc fault detection processing on the power line signal, wherein the arc fault detection processing is performed taking into account a characteristic of the power line signal.

2. The method of claim 1, wherein the arc fault detection processing is performed during a time domain quiet interval in the communication signal.

3. The method of claim 2, wherein the communication signal is suspended during the time domain quiet interval.

4. The method of claim 1, wherein the arc fault detection processing is performed during a frequency domain quiet interval in the communication signal.

5. The method of claim 1, wherein performing arc fault detection processing comprises performing signal cancellation on the communication signal.

6. The method of claim 1, wherein the arc fault detection processing is performed during an active interval in the communication signal and wherein performing the arc fault detection processing comprises discounting results of the arc fault detection during the active intervals.

7. The method of claim 1, wherein the characteristic of the power line signal comprises a protocol of the communication signal.

8. The method of claim 1, wherein:
the power line signal is communicated through a power line modem;
the arc fault detection processing is performed by an arc fault detector; and
performing the arc fault detection processing comprises receiving information at the arc fault detector from the power line modem and utilizing the received information when performing the arc fault detection processing.

9. The method of claim 8, wherein the received information comprises information related to periodic scheduled quiet intervals.

10. The method of claim 9, wherein the received information comprises information related to intervals when the communication signal is of a low value or low intensity.

11. The method of claim 1, wherein the communication signal comprises a multi-carrier signal.

12. A method of operating an arc fault detection system coupled to a power line, the method comprising:
communicating a power line signal over a power line, wherein the power line signal comprises a communication signal modulated on an alternating current (AC) power signal;
determining an arc fault detection window of time; and
performing arc fault detection processing on the power line during the arc fault detection window of time, wherein no arc fault detection is performed outside of an arc fault detection window of time.

13. The method of claim 12, wherein the communication signal comprises a multi-carrier signal.

14. The method of claim 12, wherein the arc fault detection window of time is a time period that occurs during a time domain quiet interval in the communication signal.

15. The method of claim 12, wherein no communication signal is communicated during the arc fault detection window of time.

16. The method of claim 12 further comprising scheduling the arc fault detection window of time.

17. The method of claim 16, wherein the scheduled arc fault detection window comprises at least a full cycle of the AC power signal.

18. The method of claim 12, wherein the communication signal is communicated during the arc fault detection window of time and wherein performing arc fault detection processing comprises performing signal cancellation on the communication signal.

19. A system comprising:
a power line modem configured to be coupled to a power line and to modulate and demodulate a communication signal on an alternating current (AC) power signal of the power line; and
an arc fault detector coupled to the power line modem and configured to perform arc fault detection processing on the power signal, wherein the arc fault detection processing is performed taking into account a characteristic of the communication signal.

20. The system of claim 19, wherein the power line modem is coupled to the arc fault detector and configured to signal the arc fault detector to modify detection behavior of the arc fault detector.

21. The system of claim 20, wherein the power line modem is configured to signal the arc fault detector to modify detection behavior of the arc fault detector by enabling arc fault detection, disabling arc fault detection, or identifying a protocol for the communication signal.

22. The system of claim 19, wherein the arc fault detector is integrated with the power line modem.

23. The system of claim 19, wherein the arc fault detector is configured to signal the power line modem to modify transmission behavior of the communication signal on the power line.

24. The system of claim 23, wherein the arc fault detector is configured to signal to request a time domain quiet interval or a frequency domain quiet band in the communication signal.

* * * * *